United States Patent [19]
Henson

[11] Patent Number: 5,252,176
[45] Date of Patent: Oct. 12, 1993

[54] CRYSTALLINE $SI_2HSB_2$

[76] Inventor: Robert E. Henson, 3108 Apache Cir., Thousand Oaks, Calif. 91360

[21] Appl. No.: 828,781

[22] Filed: Jan. 30, 1992

[51] Int. Cl.$^5$ .............................................. C30B 7/00
[52] U.S. Cl. ................................ 156/621; 156/623 R; 156/DIG. 64; 156/DIG. 94; 156/DIG. 99; 423/87; 423/88; 423/344
[58] Field of Search ........... 156/621, 623 R, DIG. 64, 156/DIG. 94, DIG. 99; 423/87, 88, 344

*Primary Examiner*—Olik Chaudhuri
*Assistant Examiner*—FeLisa Garrett
*Attorney, Agent, or Firm*—Jessup, Beecher & Slehofer

[57] ABSTRACT

This invention relates to a novel method of, and means for, directing energy through $Si_2HSb_2$ in such a manner that normal energy parameters can be exceeded. The principal object of the invention is to provide the means for more efficient radiant energy power systems to be constructed. For example, this invention can be applied to construct more efficient rocket propulsion systems.

$Si_2HSb_2$ has a crystalline structure with a regular pattern of electron deficiencies which physicists call "holes" in the lattice. Energy can be radiated at the top of the compound and be accelerated as it passes through to a new higher velocity as it expelled out the bottom of the compound. This is accomplished by applying electrical potentials to the sides of the compound which rectify the "holes" in the lattice. The electrical potentials applied to the sides of the compound can be varied to allow the radiated energy output to be directed in the x,y plane. Thus the compound can be used as an excellent propulsion system. It can also be used to enhance any output of a radiated energy source.

3 Claims, 1 Drawing Sheet

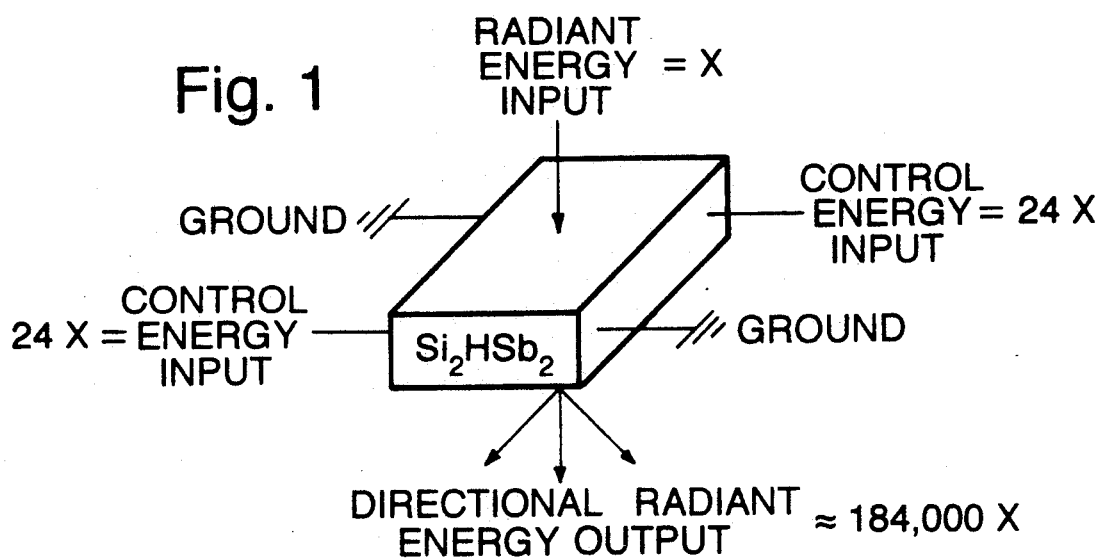
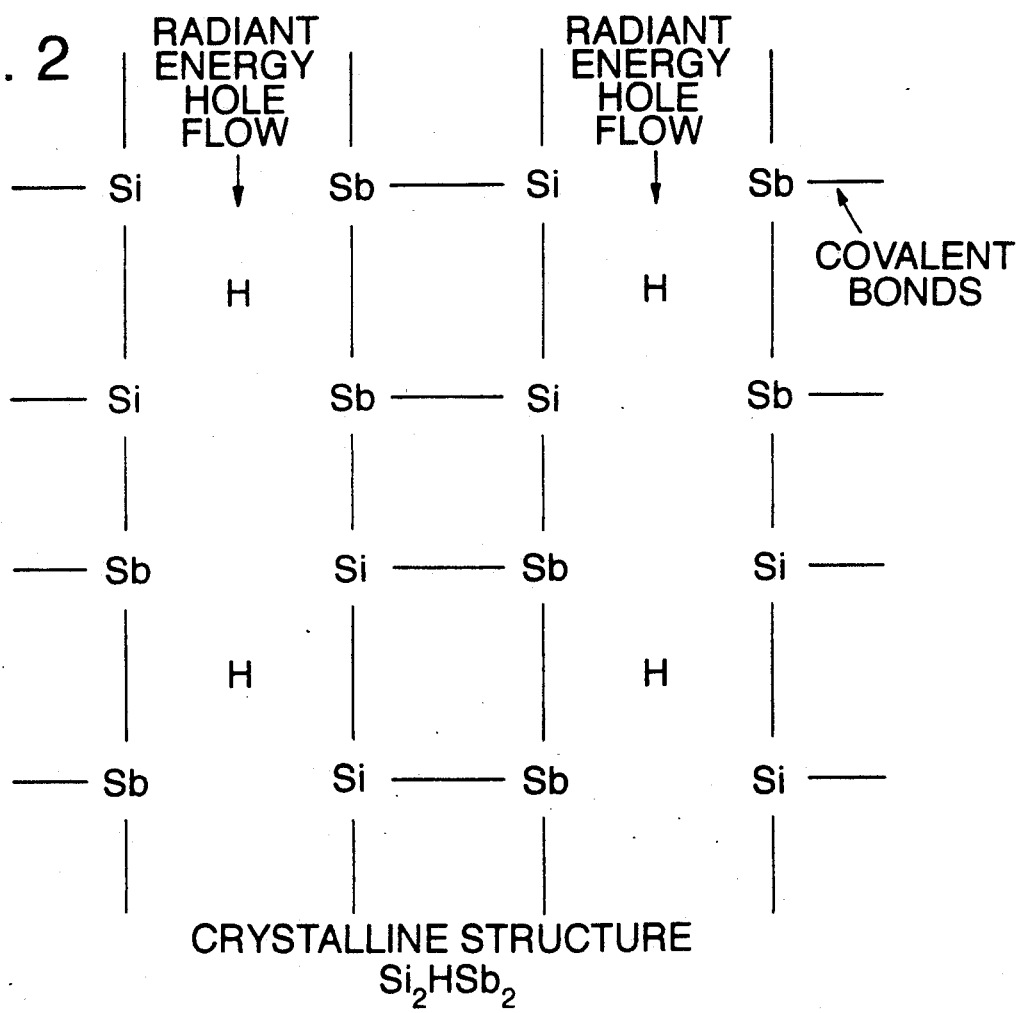

CRYSTALLINE SI$_2$HSB$_2$

BACKGROUND OF THE INVENTION

1. Field of the Invention

The field of this invention is: CLASS 423, CHEMISTRY, INORGANIC.

2. Description of the Prior Art

A patent search and a search of CHEMICAL ABSTRACTS back to 1982 was made to determine scope and extent of the prior art. The closest art known to the inventor is silicon semiconductor theory. It is well known that if a small amount (as little as 0.0001 mole per cent) of an atom of boron or other element with three valence electrons is introduced into the crystal lattice of pure silicon, an electron deficiency is created at the site of the foreign atom. This defect in the covalent bonds of the silicon atoms is described by physicists as a "positive hole." Conduction of electricity in this type of crystal, a p-type semiconductor, can be thought of as a movement of positive holes through the lattice. This invention has nothing to do with semiconduction as it relates to solid state electronics or the creation of electricity from solar radiation. The present invention creates a crystal lattice which contains a "hole" in each Si$_2$HSb$_2$ molecule. The "holes" in the present invention are more plentiful than "holes" in known p-type semiconductors. The "holes" in the present invention are regular and uniform and can be controlled by electrical potentials to allow radiant energy to pass through the compound and be accelerated and directed as it does so.

SUMMARY

The present invention includes the compound Si$_2$HSb$_2$ which is poured into a mold. The compound has electrodes molded into it. The compound is allowed to cool and crystallize and is removed from the mold. The present invention can then be used by allowing radiant energy to strike the top of the compound. The radiant energy passes through the compound and exits the bottom. The amplification factor is typically 184,000 times the power input. Electrical potentials are applied to the sides of the compound to control the "holes" in the crystal lattice. The control power must be approximately 24 times the input power. This ratio allows the proper manipulation factor for the power output to be varied in the x,y plane by varying the control power input to either side of the compound.

The present invention allows a radiant energy rocket propulsion system to be constructed. The present invention also provides the means to increase the output of any radiant energy power system. The compound does not wear out nor is it consumed. There is no chemical reaction associated with the increased radiant power output. The physical parameters of the "holes" provide a catalyst effect to produce the increased velocity in the radiant energy which is input into the top of the compound.

BRIEF DESCRIPTION OF THE DRAWINGS

FIG. 1 shows a typical arrangement of the compound which has four electrodes implanted. Radiant energy is being shown directed at the top of the compound. Control energy is applied through the electrodes to the sides of the compound. Radiant energy output is shown coming from the bottom of the compound.

FIG. 2 shows the crystalline structure of the compound and the location of the "holes" through which the radiant energy passes and is accelerated.

DESCRIPTION OF THE PREFERRED EMBODIMENT

The crystalline form of the Si$_2$HSb$_2$ compound can be manufactured using the following process:

Silicon is placed in a mixture with equal parts of antimony.

This mixture then has a dilute aqueous solution of nitric acid added to it. SiNSb precipitates out of solution. The precipitate is separated from the solution and is heated at 490–510 degrees Celsius. The substance that remains is Si$_2$NSb$_2$. This process can be described by the following chemical reactions:

$$Si + N^{3+} + HO_2^{3-} + Sb^{3-} \rightarrow SiNSb + HO_2^{3-}$$

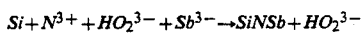

$$SiNsb + SiNSb \rightarrow Si_2NSb_2 + N^{3-}$$

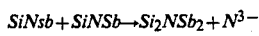

Silicon is placed in a mixture with antimony in equal parts and the mixture is immersed in pure water. This mixture is then subjected to 490–510 degrees Celsius. The SiHSb precipitates and is then extracted. The SiHSb is then subjected to 490–510 degrees Celsius. The noncrystalline compound Si$_2$HSb$_2$ remains after the other compounds have boiled away. This process can be described by the following chemical reactions:

$$Si + H^+ + HO^- + Sb^{3-} \rightarrow SiHSb + HO^-$$

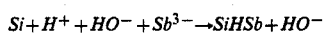

$$SiHSb + SiHSb \rightarrow Si_2HSb_2 + H^+ \text{ (This product won't crystallize in the correct manner.)}$$

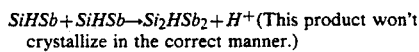

The solids, Si$_2$HSb$_2$ and Si$_2$NSb$_2$, are then put in a mixture of equal parts. An exothermic reaction results after the reaction is started with a 490–510 degree Celsius application of heat. A Si$_2$Sb liquid forms on top of the mixture and is poured off. The Si$_2$HSb$_3$ resultant is the solid. This process can be described by the following chemical reaction:

$$Si_2HSb_2 + Si_2NSb_2 \rightarrow Si_2HSb_3 + Si_2Sb$$

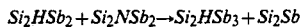

The Si$_2$HSb$_3$ is then subjected to prolonged heating at 370–380 degrees Celsius. This heating causes Si$_2$HSb$_2$ to form as a liquid on the top of the Si$_2$HSb$_3$. This liquid, when poured off, is the required compound. This process can be described by the following chemical reaction:

$$Si_2HSb_3 \rightarrow Si_2HSb_2 + Sb^{3-}$$

The Si$_2$HSb$_2$ compound is poured into the form which gives it the proper shape and the electrodes are placed in the proper locations at the sides of the form. The liquid is allowed to cool to the required solid shape. It crystallizes as it cools. The crystal can be formed into any shape and it will still retain its ability to amplify energy.

The crystal actually works as a energy particle accelerator. It has all of the necessary characteristics of a conventional energy accelerator but it accelerates the particles at a molecular level using strong nuclear forces. The crystal incorporates all of the aspects of other conventional accelerators. A source of energy particles is directed at the crystal, strong nuclear forces induce the acceleration, the electron deficient "holes" act as an evacuated space in which the particles may move unimpeded, and a means for guiding the particles to keep them within the space is provided by the structure of the covalent bonds between the silicon an antimony.

A good question of this system is how a particle such as a photon traveling at the speed of light could be further accelerated as it passed through this crystal. The answer to that question could be that the crystal accelerator provides an energy gain from its strong nuclear forces to the particles which shows up as an increase of their effective mass. Another answer is that the energy law $E=Mc^2$ is changed when radiant energy units are subjected to certain forces such as the nuclear forces in the crystal. The speed of light is no longer limited and it conforms to the new equation $E=McX$. The value of X in the crystal approaches $3 \times 10^{20}$ meters per second.

The crystal has a unique property of allowing radiant energy to be directed at it and the speed of the energy is increased as it passes through the crystal. This is accomplished through a process in which the energy particles are acted upon by strong nuclear forces which are put into play because of the unusual structure of the crystal. The covalent bonds between the silicon and antimony stabilize the elements and maintain the crystalline structure. The hydrogen element which is uniformly dispersed in the crystal causes an anomaly in the crystal which is commonly called a "hole." It is an electron deficient area which is held open through nuclear forces until a negatively charged particle occupies the space. These nuclear forces act to attract an electron or any unit of energy such as a light photon or a gamma ray. This attraction of energy particles can be multiplied as the particle passes through the crystal from one molecular crystal unit zone of attraction to another. This multiplication of attractive forces accelerates the energy unit as it passes through the crystal and can make the particle exceed the speed of light. Since energy output is a function of mass and speed of the mass squared, any increase in particle speed causes a dramatic increase in energy output with very little control energy input. The control energy input to the system is required to align the hydrogen elements within the crystalline structure. These protons surrounded by holes can be moved in the x,y plane by applying the appropriate charges to the sides of the crystal. The application of these charges causes a displacement of the energy units being amplified through the crystal because of the attractive and repulsive effect of the proton as the particles pass through or in close proximity to the proton's energy field.

The energy particle dynamics as they pass through the crystal are very unique. The particles are accelerated by passing close to the proton in such a manner that they are effected by its nuclear forces. The protons are all aligned so that the accelerations are built upon from proton to proton. This effect is similar to the increase in velocity given to satellites which pass in close proximity to the orbit of a planet but have sufficient velocity to escape the gravitational pull of the planet and are propelled out of orbit and again into space.

The types of energy which can be amplified by the crystal are infinite. Radiant energy from infrared to high energy particles produced by fusion or fission can be amplified. A large crystal can be used in conjunction with radiant energy from the sun to provide enough heat output to power a typical city. A smaller crystal can be used in conjunction with fission reactions to power vehicles. The vehicular power to weight ratios allow the vehicles to fly. The crystal can be used in conjunction with an electron emitter to enhance the power output of many electrical devices. The crystal can be used in conjunction with any type of laser to radically improve its output. A large crystal could amplify radiant energy from the sun which could then be reflected through the use of mirrors to other crystals which would further enhance the output. The ability of a crystal to amplify energy is limited. If highly energized particles are directed at the crystal with sufficient magnitude and duration, the crystal can overheat and begin to melt. A larger crystal is able to withstand larger magnitude and duration energy inputs. The size of the crystal also determines the amplification factor of the input versus output of energy. The thicker the crystal, the more amplification it can provide to energy input. The crystal is very durable. It does not wear out or become weaker over time. The nuclear forces which speed the energy through the crystal are natural forces which are similar to gravity in the respect that it is a force which never weakens or is used up. The crystal is also durable with respect to its ability to withstand physical abuse. It can be used as the exterior skin of a vehicle which it is powering.

A more detailed description of putting this crystal power amplifier to practical use is in order. The crystal can be used to power a vehicle capable of flying into outer space. The entire bottom of the craft could be composed of the formed crystal. The remaining skin of the craft could be composed of $SiPbSb_3$ in sheets of approximately $\frac{1}{4}''$ to $1''$. The power supply of the craft could be the energy released from a radioactive isotope of uranium. The radiant energy emanating from the fission reaction could be controlled in the same manner that is currently used in naval propulsion systems. The nuclear fission radiant energy output would be shielded at its top and sides, but the energy irradiated downward could be directed at the top of the crystal. The crystal could then amplify this radiant energy by a factor of 184,000. This power to weight ratio would allow the craft to overcome the earth's gravitational field and proceed into space with an intact and long lasting power supply. The craft could be controlled by varying the power input to the electrodes on the sides of the crystal causing the radiant power output from the craft to be directed in the x,y plane. The optimum control power ratio to allow the craft to be directionally controlled with the proper finesse occurs when the control power input is 24 times the radiant power input to the crystal. The control power input can be developed utilizing generators powered by the output of the crystal.

This type of craft would only be limited by the size of the power supply. It would be very stable both in the atmosphere and in outer space. The maximum velocity in the atmosphere would be limited by the maximum hull temperature of 500 degrees Celsius.

What is claimed is:

1. Process for preparing crystalline $Si_2HSb_2$ comprising the following steps:
    placing equal parts of Silicon and Antimony in a first mixture;
    adding dilute aqueous solution of nitric acid to said Silicon-Antimony first mixture to form a first solution;
    allowing SiNSb to precipitate from said first solution;
    separating said SiNSb precipitate from said first solution;

heating said SiNSb precipitate at 490-510 degrees Celsius for a sufficient period until $Si_2NSb_2$ remains;

placing equal parts of Silicon and Antimony in a second mixture immersed in pure water;

heating said second mixture at 490-510 degrees Celsius until SiHSb precipitates;

extracting said SiHSb from said second mixture;

heating said SiHSb at 490-510 degrees Celsius until only noncrystalline $Si_2HSb_2$ remains after the other ingredients are boiled off;

placing equal parts of $Si_2HSb_2$ and $Si_2NSb_2$ in a third mixture;

heating said third mixture at 490-510 degrees Celsius until a $Si_2Sb$ liquid forms on top of a $Si_2HSb_3$ solid;

extracting said $Si_2HSb_3$ solid from said third mixture by pouring off said $Si_2Sb$ liquid;

heating said $Si_2HSb_3$ solid at 370-380 degrees Celsius for a sufficient period until $Si_2HSb_2$ liquid forms on the top of said solid $Si_2HSb_3$;

extracting said liquid $Si_2HSb_2$ by pouring it off said solid $Si_2HSb_3$.

2. The process as recited in claim 1 further comprising:

forming a mold;

taking at least one electrode that has an anchor post and a connection post and placing said anchor post in said cavity of said mold and having said connection post extending from said mold;

pouring said liquid $Si_2HSb_2$ into the mold;

allowing the electrode and the liquid $Si_2HSb_2$ to cool to room temperature to form a piece of solid $Si_2HSb_2$ having said electrode posts extending from said piece of solid.

3. The process as recited in claim 2 further comprising:

forming said molded $Si_2HSb_2$ with said post ends of said electrodes free to be connected to a source of electricity;

applying said molded $Si_2HSb_2$ to a vehicle;

applying electricity to said electrode poles;

irradiating one side of the said molded $Si_2HSb_2$ with energy whereby said propulsion of said vehicle is caused by the emission of said irradiated energy from said $Si_2HSb_2$.

* * * * *